(12) United States Patent
Falagan Bobillo et al.

(10) Patent No.: US 11,063,566 B2
(45) Date of Patent: Jul. 13, 2021

(54) RF MODULE AND METHOD FOR TESTING AN RF MODULE

(71) Applicant: SNAPTRACK, INC., San Diego, CA (US)

(72) Inventors: Miguel Angel Falagan Bobillo, Munich (DE); Andreas Detlefsen, Eichenau (DE)

(73) Assignee: Snaptrack, Inc., San Diego, CA (US)

( * ) Notice: Subject to any disclaimer, the term of this patent is extended or adjusted under 35 U.S.C. 154(b) by 0 days.

(21) Appl. No.: 16/347,119

(22) PCT Filed: Nov. 28, 2017

(86) PCT No.: PCT/US2017/063452
§ 371 (c)(1),
(2) Date: May 2, 2019

(87) PCT Pub. No.: WO2018/106478
PCT Pub. Date: Jun. 14, 2018

(65) Prior Publication Data
US 2019/0280660 A1     Sep. 12, 2019

(30) Foreign Application Priority Data

Dec. 5, 2016  (DE) .......................... 102016123474.5

(51) Int. Cl.
*H03F 1/12*     (2006.01)
*H03F 3/72*     (2006.01)
*H03F 3/195*    (2006.01)
*H03F 3/24*     (2006.01)
*H03F 1/56*     (2006.01)

(52) U.S. Cl.
CPC ................ *H03F 3/72* (2013.01); *H03F 1/56* (2013.01); *H03F 3/195* (2013.01); *H03F 3/245* (2013.01); *H03F 2200/111* (2013.01); *H03F 2200/387* (2013.01); *H03F 2203/7224* (2013.01)

(58) Field of Classification Search
CPC ........................................................ H03F 1/12
USPC .................................................. 330/51, 305
See application file for complete search history.

(56) References Cited

U.S. PATENT DOCUMENTS

| | | | | |
|---|---|---|---|---|
| 6,031,421 A | * | 2/2000 | McEwan | G01S 7/34 330/10 |
| 7,856,048 B1 | * | 12/2010 | Smaini | H04B 1/40 330/2 |
| 9,231,680 B2 | * | 1/2016 | Gorbachov | H04B 1/48 |
| 9,660,687 B2 | | 5/2017 | Ellä et al. | |
| 2003/0157907 A1 | | 8/2003 | Leinonen et al. | |
| 2007/0236296 A1 | | 10/2007 | Lee et al. | |
| 2009/0256644 A1 | | 10/2009 | Knudsen et al. | |
| 2010/0117669 A1 | | 5/2010 | Clarke et al. | |

(Continued)

FOREIGN PATENT DOCUMENTS

WO     2013041146 A1     3/2013

OTHER PUBLICATIONS

International Search Report and Written Opinion—PCT/US2017/063452—ISA/EPO—dated Feb. 16, 2018.

*Primary Examiner* — Henry Choe

(57) ABSTRACT

An RF module with improved testing capabilities is provided. The module has a first switch with signal outputs and an additional auxiliary connection connected to an auxiliary terminal. The auxiliary terminal can be connected to an RF filter while a power amplifier is decoupled from the filter.

19 Claims, 5 Drawing Sheets

(56) References Cited

U.S. PATENT DOCUMENTS

| | | |
|---|---|---|
| 2010/0225414 A1 | 9/2010 | Gorbachov |
| 2012/0289167 A1 | 11/2012 | Vogas et al. |
| 2015/0293159 A1 | 10/2015 | Van et al. |
| 2016/0261729 A1 | 9/2016 | Kim |

* cited by examiner

RF MODULE AND METHOD FOR TESTING AN RF MODULE

CROSS-REFERENCE TO RELATED APPLICATION

This application is a national stage application under 35 U.S.C. § 371 of PCT/US2017/063452, filed Nov. 28, 2017, which claims priority to German Patent Application No. 102016123474.5, filed Dec. 5, 2016, which are incorporated herein by reference in their entirety for all applicable purposes.

DESCRIPTION

The present invention refers to RF modules, e.g. modules with integrated power amplifiers for mobile communication devices, and to methods for testing such modules.

The current trend towards miniaturization of electric and electronic components of mobile communication devices demands for a higher degree of integration of an increasing number of circuit elements in a smaller volume. As a consequence, more and more electric and electronic functions are integrated together in modules. RF modules, e.g. in mobile communication devices, can comprise active and passive circuit elements. Active circuit elements can be power amplifiers or semiconductor switches. Passive circuit elements can be filters such as bandpass filters or band rejection filters and matching elements.

One result of the above-mentioned ongoing trend towards miniaturization is the creation of power amplifier modules with integrated duplexers (PAMiD). Such modules comprise at least one power amplifier and two or more duplexers. The power amplifier may be a multiband power amplifier. The performance of such a module is defined by parameters such as the maximum output power, the power added efficiency, the adjacent channel power ratio, the error vector magnitude, the isolation between transmission(TX) signal paths and reception(RX) signal paths, i.e. the leakage of fundamental power and power amplifier noise in an RX band to a reception path. The performance of such modules is determined by the performance of active circuit elements such as power amplifiers and the performance of passive circuit elements such as filters and matching elements that are grouped in the frontend (FE) section of the module as well as the electromagnetic characteristics of a module substrate. One important factor in determining the performance of a module is the determination of the impedance that presents the frontend section to the power amplifier. Further important factors are in-band losses and out-of-band attenuation in transmission paths as well as isolations between transmission paths and reception paths.

However, due to the high degree of integration, the above-mentioned parameters and factors cannot be measured independently because the frontend section is coupled to the power amplifier and the corresponding module performance parameters are influenced by it. This complicates both the design of such modules and the performance measurements after production which should be employed for every produced module to filter out faulty devices.

In principle, it would be possible to determine the behavior of the frontend section without considering the contributions caused by the power amplifier by a simulation. However, simulating the frontend section will not help finding faulty devices after production. Another possibility to directly monitor the properties of the frontend section would be to manufacture the frontend section and the power amplifier independently. After testing the power amplifier and the frontend section, the two units could be combined to a single component. However, then additional contact pins would be needed, which is problematic due to the trend towards miniaturization as there is only limited space. Additionally, such a procedure would be very time consuming and costly and would result in additional parasitic effects.

As a consequence thereof, the wish exists to have RF modules of which passive circuit elements can directly be tested without mutual influence between a power amplifier and the frontend section.

To that end, the independent claims provide an RF module and a method for testing an RF module that are compatible with the above-mentioned requirements.

The RF module comprises a signal input, a signal output and an auxiliary terminal. Further, the module comprises a power amplifier electrically connected between the signal input and the signal output. Additionally, the module has a first switch electrically connected between the power amplifier and the signal output and an RF filter section electrically connected between the first switch and the signal output. The RF filter section has a first RF filter and a second RF filter electrically connected in parallel to the first RF filter.

The first switch has a signal input, two or more signal outputs and an auxiliary connection. A first signal output of the first switch is coupled to the first RF filter. A second signal output of the first switch is coupled to the second RF filter. The auxiliary connection is coupled to the auxiliary terminal. The first switch has an analysis mode where the auxiliary connection is connected to one of the two signal outputs of the first switch.

In such an RF module, the first switch can either establish a connection between the power amplifier and one of the filters. Such a direct connection is used for normal operation. However, the first switch can decouple the signal outputs that are connected to the filters from the power amplifier but connect at least one of the signal outputs to an auxiliary terminal which may be an external terminal via which the filter section with the filters can be directly accessed via an external testing environment. As the power amplifier is decoupled from the filter section, the filter section's parameters and performance can be determined without any influence from the power amplifier. In particular, the electrical impedance that is presented towards the power amplifier can be directly determined.

After manufacturing such a module, the first switch is switched into the analysis mode. In the analysis mode, it is possible to directly contact each of the switches signal output individually to the auxiliary terminal. Thus, even if the module comprises a plurality of filters in a plurality of parallel signal path sections, each signal path section can be tested individually.

It is possible that the RF filters are transmission (TX) filters of duplexers. Each of the duplexer also has a reception (RX) filter.

Each duplexer can be electrically connected to the signal output, which may be an antenna port, and to an individual reception port. Then, via corresponding switching states in the analysis mode, via the auxiliary terminal, the antenna terminal and the individual reception terminals, a plurality of segments of the signal paths exist that can be tested individually and without influence from the power amplifier.

It is possible that the first switch is a transmission(TX) switch. A transmission switch is utilized to connect a single power amplifier, which may be a multiband power amplifier, to two or more signal paths sections where each section has its own RF filters that are dedicated to a selected frequency band. Thus, a single power amplifier can be utilized for several frequency bands instead of providing one power amplifier for each frequency band.

It is possible that the module further comprises one or more matching networks. Each matching network is electrically connected between a signal output of the first switch and the corresponding RF filter.

The matching network of one signal path section allows optimizing the impedance matching between the power amplifier and the frontend section. Each matching network may comprise passive circuit elements such as inductance elements and capacitance elements.

It is possible that a module further comprises a second switch electrically coupled between the first switch and the signal output. The second switch may be utilized to individually select one of the RF filters to be connected to the signal output.

It is possible that the second switch is an antenna switch and has an antenna terminal and an auxiliary terminal. In particular, it is possible that the second switch has one connection towards the signal output and at least one connection per signal output of the first switch. Then, between a signal output of the first switch and the corresponding connection of the second switch, a plurality of segments of the signal path are electrically connected in parallel between the two switches.

It is possible that the power amplifier is a multi-band amplifier.

Then, it is possible that the RF module is a power amplifier module with integrated duplexers(PAMiD).

It is possible that the RF module further comprises a switch register. The analysis mode can be activated by one or more switch register settings.

In the analysis mode the auxiliary connection can be connected to an external circuit environment, e.g. for testing the module's different sections.

Such a module allows a high degree of integration of a plurality of electric and electronic functions within a small volume complying with the trend towards miniaturization while allowing to determine the performance of the frontend section of the module without interaction with the power amplifier.

It is possible to de-embed the auxiliary terminal after manufacturing and to switch the first switch in the analysis mode to analyze the frontend section. If the module, in particular the frontend section of the module, supports frequency bands of filters arranged outside the module, it is possible that this auxiliary terminal is used to electrically connect the first switch to those filters outside the module. Then, the module and additional filters can be arranged on a common carrier substrate.

During testing, the same device under test can be used to evaluate the performance of the frontend section, the overall module performance and the performance of the power amplifier without a coupling to the frontend section. Thus, a correlation between the module's sections can be obtained easily and effort to the design process and to the testing process is reduced.

In particular, the module can be used to test the TX to RX isolation, in particular for each individual segment of the signal path, for each produced device to determine whether specified criteria are met.

Accordingly, a method for testing an RF module comprising a power amplifier, a first switch and a filter section is provided. The method comprises the steps: Switching the first switch in an analysis mode where the switch connects an auxiliary terminal to the filter section and decouples the filter section from the power amplifier;

Testing the filter section without influence from the power amplifier via the auxiliary terminal.

It is possible that the analysis mode is activated by an appropriate switch register setting.

Central aspects of the present RF module, basic working principles and details of preferred embodiments are shown in the accompanying figures.

Figure 1:
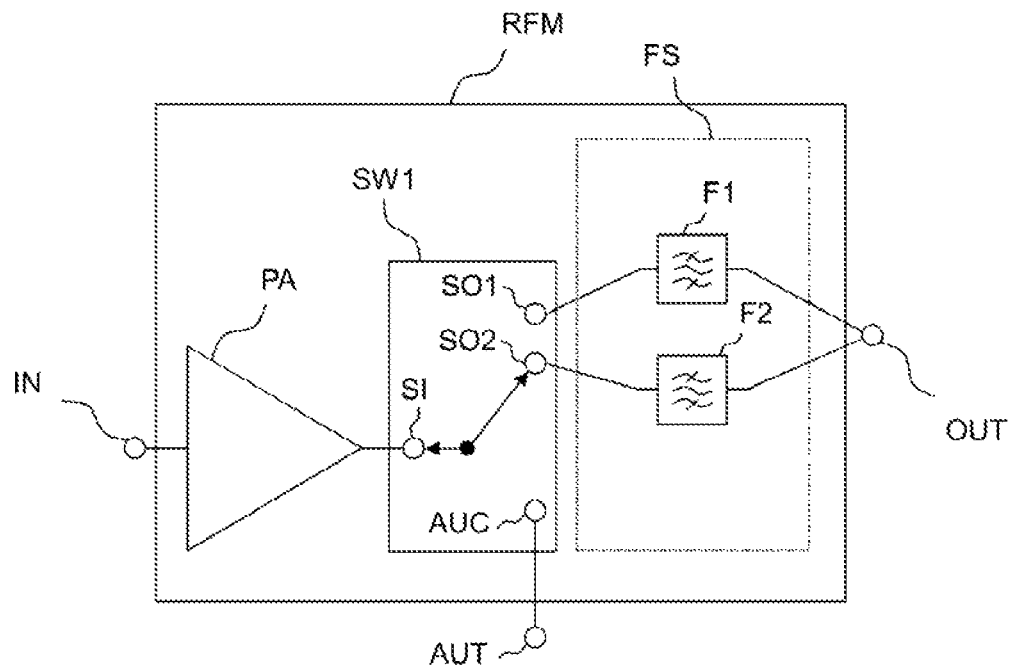
FIG. 1 shows basic circuit elements of the module where the switch is in a mode of normal operation.

FIG. 1 shows basic circuit elements of the RF module RFM. The module has a signal input IN and a signal output OUT. A power amplifier PA is electrically connected between the signal input IN and the output OUT. A first switch SW1 is electrically connected between the power amplifier PA and the signal output OUT. A first filter F1 and a second filter F2 which are elements of the filter section FS are electrically connected between the first switch SW1 and the signal output OUT. Within the filter section FS, the two filters are electrically connected in parallel. The first switch SW1 has a signal input SI and a plurality, e.g. two, of signal outputs S01, S02. Additionally, the first switch SW1 has an auxiliary connection AUC. The auxiliary connection AUC is connected to an auxiliary terminal AUT. During normal operation, the first switch SW1 is electrically connected at its input side to the power amplifier PA. At its output side, at least one of the filters is connected to establish a signal connection from the signal input IN to the signal output OUT.

In such a switching configuration, the filter in use is electrically coupled to the power amplifier and its parameters and properties cannot be determined independently. The presence of the power amplifier PA with its usually very low impedance has influence on how the filters present themselves to their circuit environment.

Figure 2:
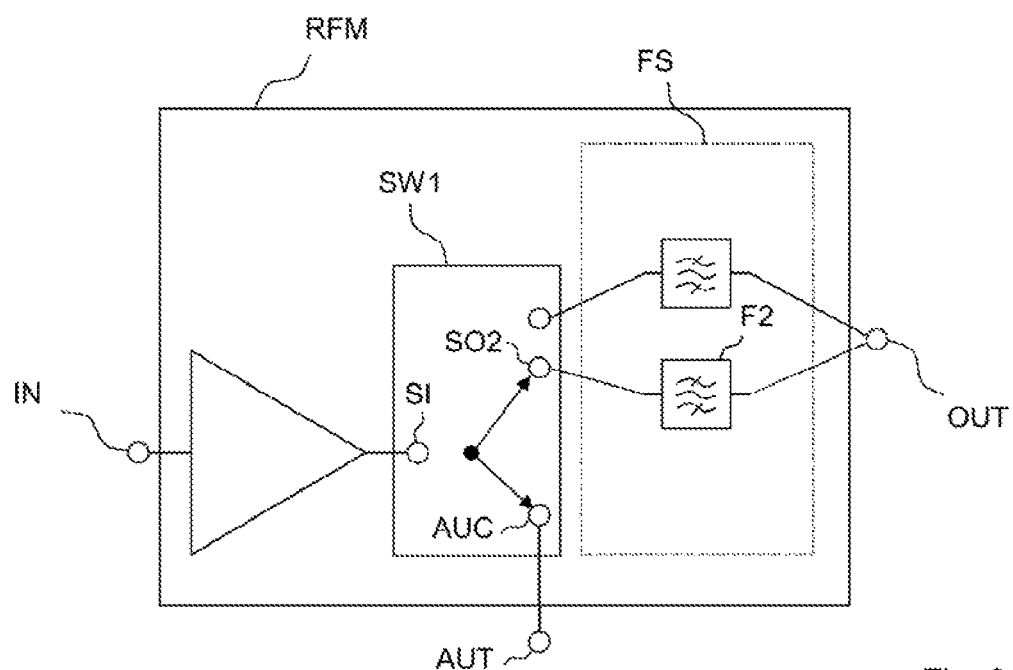
FIG. 2 shows the module of FIG. 1 in one state of the analysis mode.

In contrast, FIG. 2 shows the switching configuration where the first switch SW1 establishes a connection to the auxiliary terminal AUT via its auxiliary connection AUC. Now, as the first switch SW1 is in an analysis mode, a conducting connection between the auxiliary terminal AUT and the filters of the filter section FS exist independent from the presence of the power amplifier. The first switch SW1 is able to either connect the first filter or the second filter F2 to the auxiliary terminal AUT or—when more filters are present—each segment of the signal path individually to the auxiliary terminal to individually determine the performance of the filter section FS without being influenced by the power amplifier PA.

It is possible that the module has further electrical connections to transmit control signals to the first switch SW1 to either enter or leave the analysis mode. Within the analysis mode, it is possible to choose which of the signal outputs of the first switch SW1 should be connected to the auxiliary terminal AUT.

Figure 3:
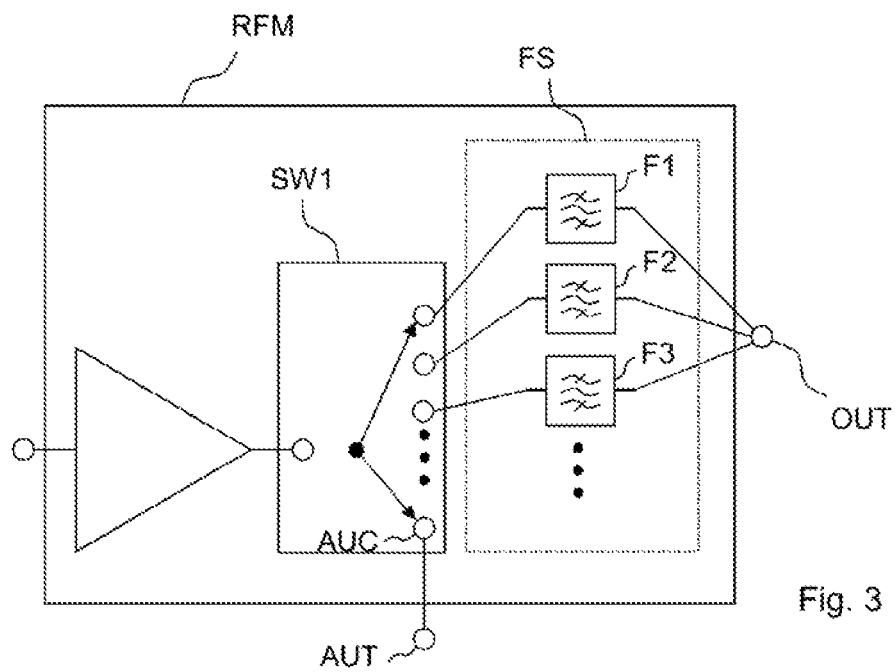
FIG. 3 shows a module comprising a plurality of RF filters.

FIG. 3 shows the first switch SW1 being in the analysis mode, i.e. electrically connecting at least one of the signal outputs of the first switch SW1 to the auxiliary connection AUC. The number of filters and the number of signal outputs of the first switch SW1 is not limited to two. The respective number can be 3, 4, 5, 6, 7, 8, and higher.

Figure 4:
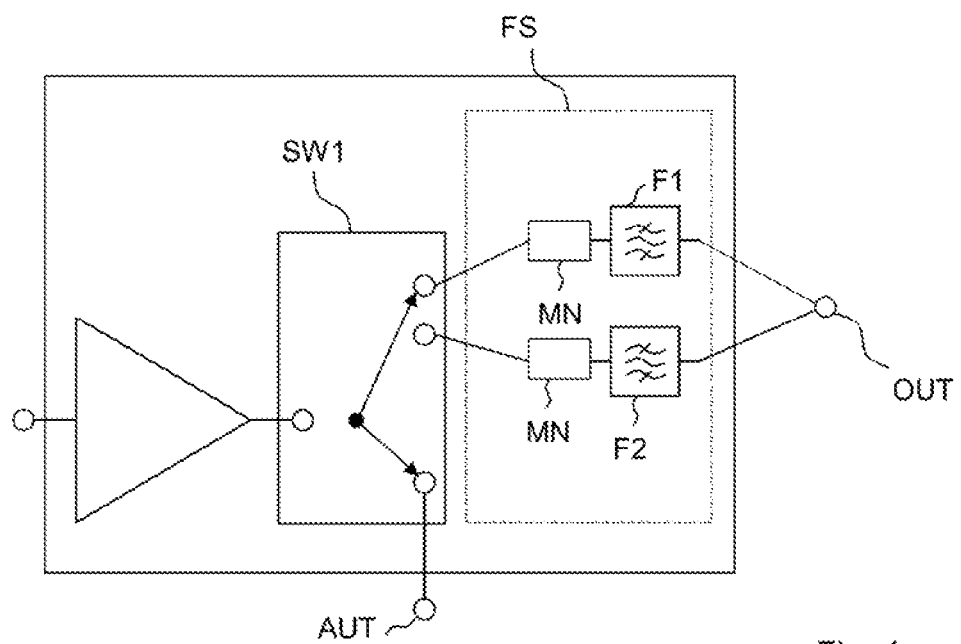
FIG. 4 shows the use of matching networks.

FIG. 4 shows the possibility of electrically connecting a matching network MN between a signal output of the first switch SW1 and one of the filters, e.g. the first filter F1 or the second filter F2. It is also possible that each of the filters has its own dedicated matching network between the filter itself and the corresponding signal output of the first switch SW1.

Figure 5:
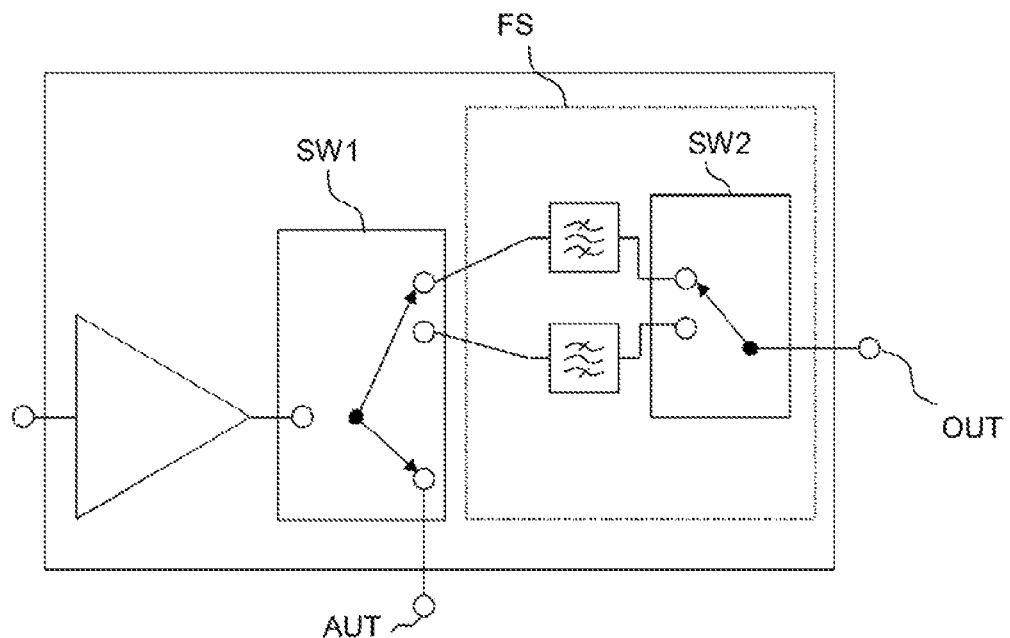
FIG. 5 shows the use of a second switch.

FIG. 5 shows circuit elements of an RF module having a second switch SW2. The second switch SW2 is electrically connected between the filters and the signal output OUT. Via the second switch SW2, it is possible to elect one of the segments of the signal path to be exclusively connected to the signal output OUT. The second switch SW2 can be an antenna switch and the signal output OUT can be an antenna port.

Figure 6:
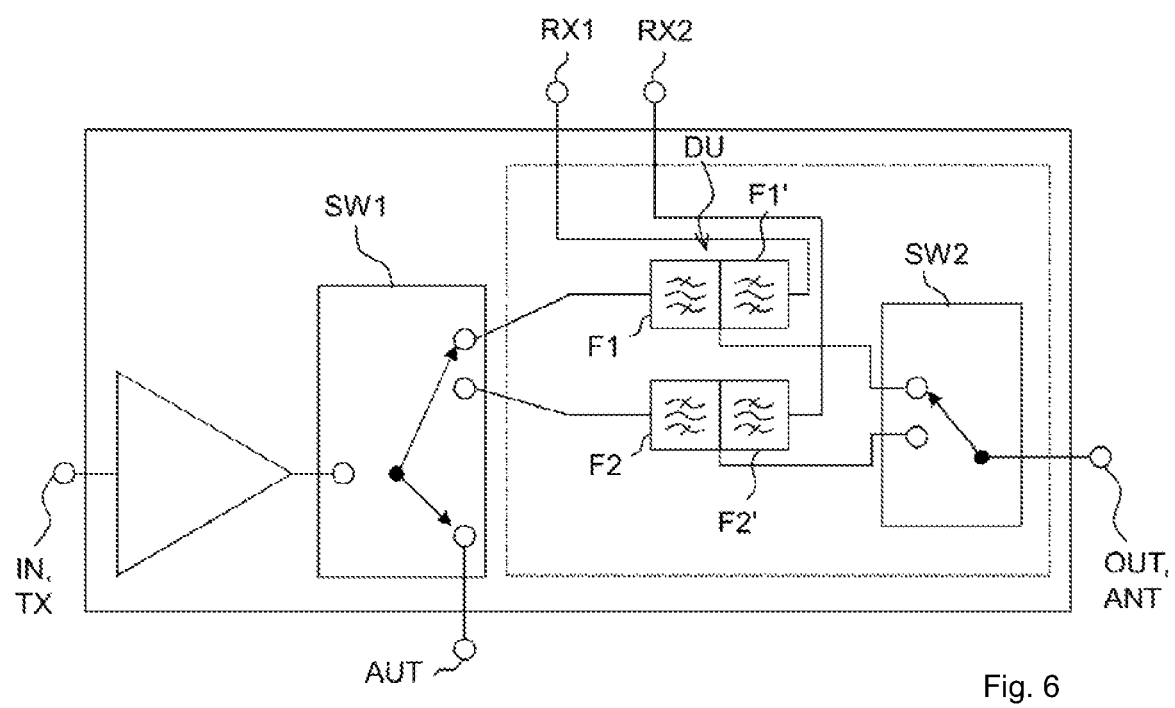
FIG. 6 shows the use of duplexers.

FIG. 6 shows circuit elements of an RF module where the filters are filters of a corresponding duplexer DU. A duplexer has the previously mentioned filter F1, F2 as its first filter and an additional filter F1', F2' as a second filter. Each duplexer DU is connected between the first switch SW1 and the output OUT. Additionally, each duplexer DU is electrically connected to another port which may be a reception port RX. By way of example, FIG. 6 shows the possibility of arranging two duplexers DU in the module. Each of the duplexers' filters connected to the first switch SW1 is a TX filter and each of the respective other filters is a reception filter electrically connected to the corresponding reception port RX1, RX2. Then, the signal input IN is a transmission port TX and the signal output OUT is an antenna port ANT.

Figure 7:
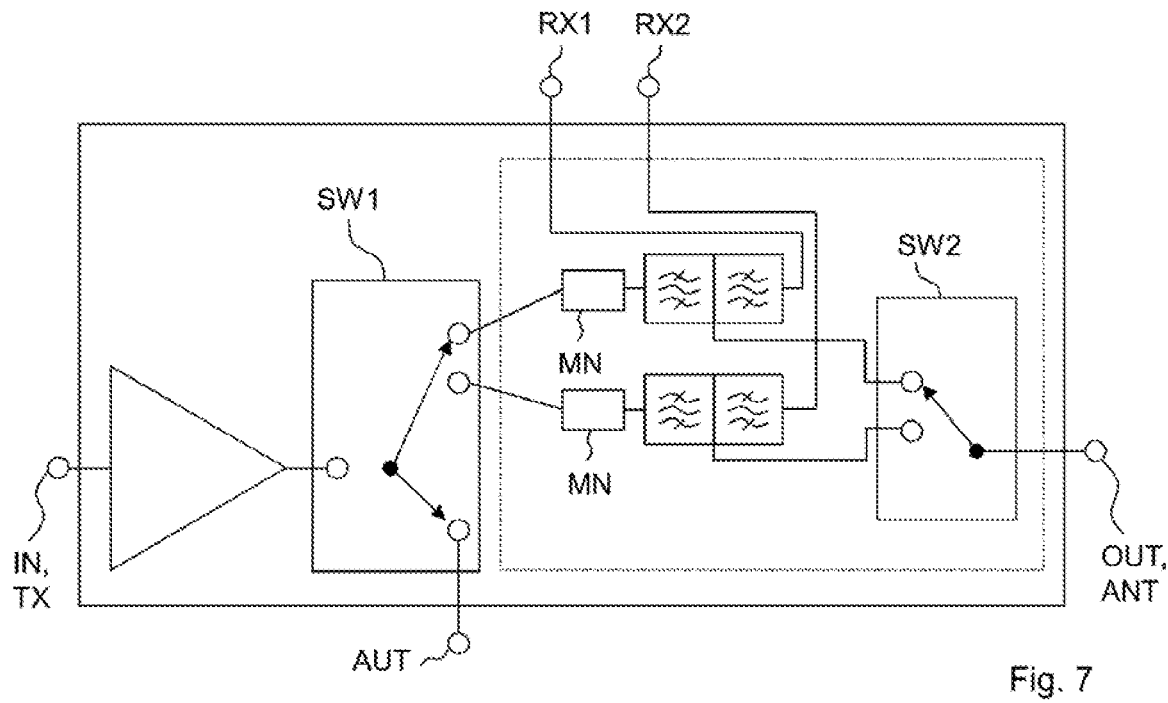
FIG. 7 shows the use of matching networks, duplexers and the second switch.

As FIG. 7 shows, each of the duplexers can additionally be provided with a matching network between the corresponding signal output of the first switch SW1 and the transmission filter of the duplexer.

Figure 8:
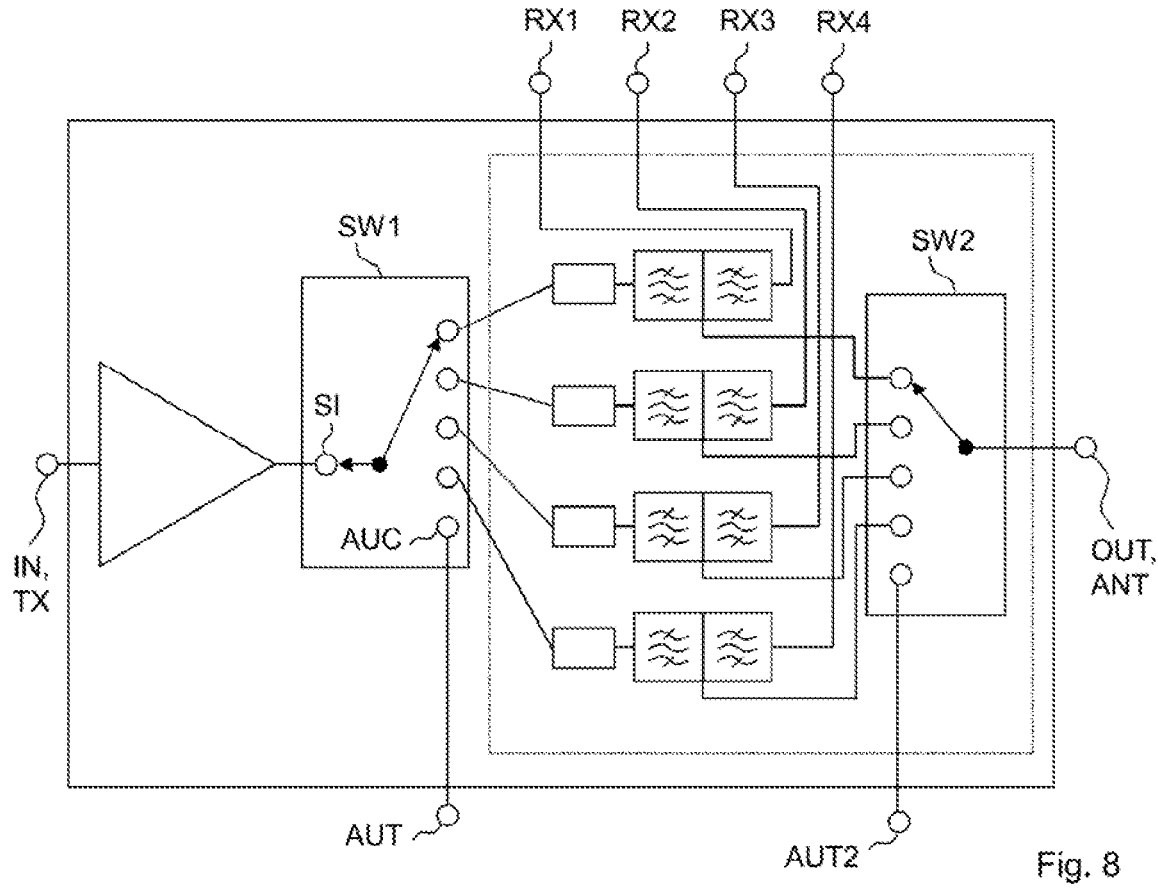
FIG. 8 shows one embodiment of an RF module with a high integration density during normal operation.

FIG. 8 shows circuit elements of an embodiment with one power amplifier, a first switch SW1, a second switch SW2 and four duplexers, each having a matching network. Each of the duplexers can be provided to allow transceiving (transmitting and receiving) functionality in one or more frequency bands. Accordingly, the power amplifier can be a quad-band power amplifier or a power amplifier working in still more frequency bands. The first switch has four corresponding signal out-puts, a signal input SI and the auxiliary connection AUC.

The second switch SW2 between the duplexers and the signal output OUT has four signal inputs (one for each duplexer) and an additional auxiliary connection that is connected to an additional, second auxiliary terminal AUT2.

The first switch SW1 is in a mode of normal operation, i.e. the first switch SW1 connects the signal input SI connected to the power amplifier to one of the segments of the signal path.

Figure 9:
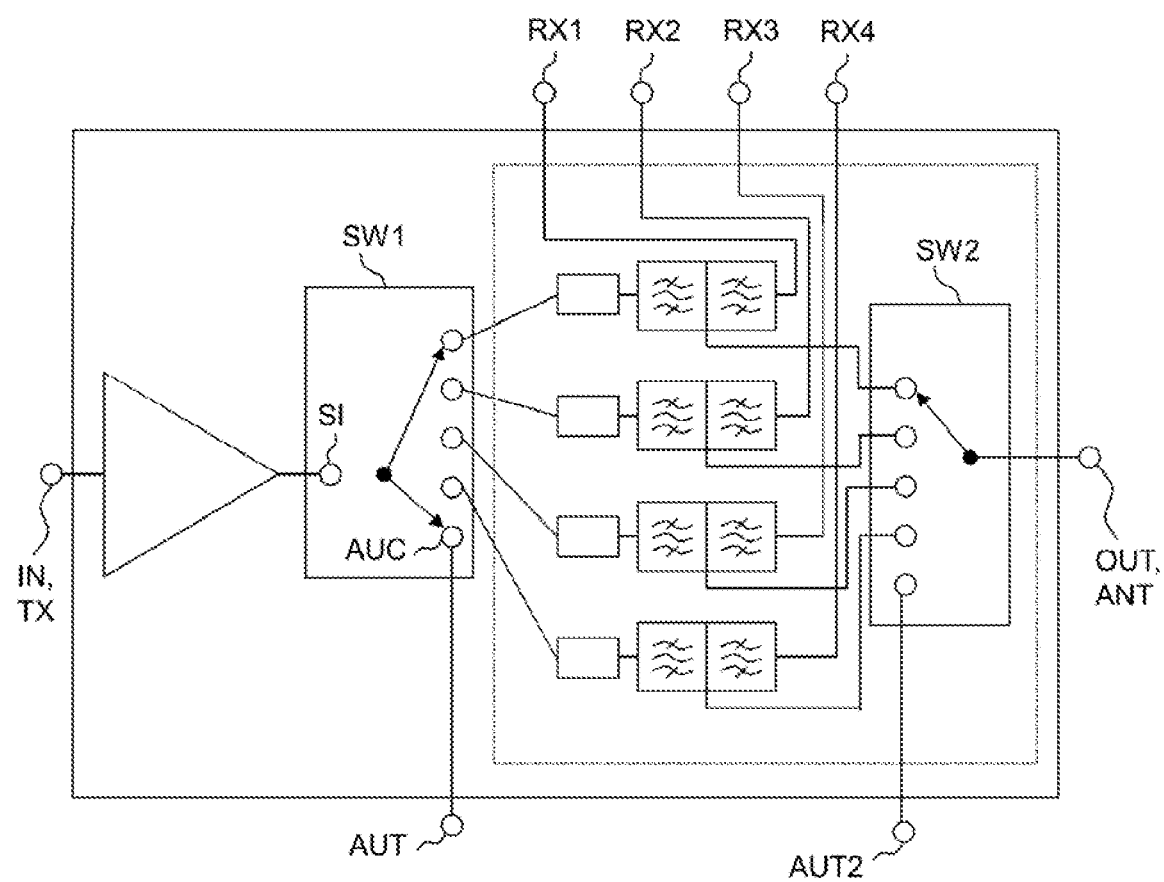
FIG. 9 shows the module of FIG. 8 where the first switch is in one possible state of the analysis mode.

FIG. 9 shows the RF module of FIG. 9. However, the first switch SW1 is in the analysis mode connecting one of the segments of the signal path via the auxiliary connection AUC to the auxiliary terminal AUT.

Thus, with a single auxiliary terminal AUT, each of the plurality of filters or duplexers can be tested individually, i.e. without interaction with another duplexer and without interaction with the power amplifier.

The RF module and the method for testing an RF module are not limited to the described details. Modules can comprise further signal paths and further circuit elements in signal paths, e.g. additional power amplifiers and additional antenna ports.

Methods of testing RF modules can comprise further steps, e.g. for choosing individual segments of the signal path or for setting the second switch in a preferred switching state.

LIST OF REFERENCE SIGNS

ANT: antenna port
AUC: auxiliary connection
AUT: auxiliary terminal
AUT2: second auxiliary terminal
F1: first filter
F1I=first reception filter
F2: second filter
F2I=second reception filter
F3: third filter
FS: filter segment
IN: signal input
MN: matching network
OUT: signal output
PA: power amplifier
RFM: RF module
RX1: first reception terminal
RX2: second reception terminal
SI: signal input
S01: first signal output
S02: second signal output
SW1: first switch
SW2: second switch
TX: transmission port

The invention claimed is:

1. A radio frequency (RF) module comprising:
   a signal input;
   a signal output;
   an auxiliary terminal;
   a power amplifier electrically connected between the signal input and the signal output;
   a first switch electrically connected between the power amplifier and the signal output; and
   an RF filter section electrically connected between the first switch and the signal output, wherein:
   the RF filter section has a first RF filter and a second RF filter electrically connected in parallel with the first RF filter; and
   the first switch has a signal input, two or more signal outputs, and an auxiliary connection, wherein:
      a first signal output of the two or more signal outputs is coupled to the first RF filter;
      a second signal output of the two or more signal outputs is coupled to the second RF filter;
      the auxiliary connection is coupled to the auxiliary terminal; and
      the first switch is configured such that, during an an analysis mode, the auxiliary connection is electrically connected to one of the two or more signal outputs.

2. The RF module of claim 1, wherein the first and second RF filters are transmission filters of respective duplexers, each duplexer comprising a reception filter.

3. The RF module of claim 1, wherein the first switch is a transmission switch.

4. The RF module of claim 1, further comprising one or more matching networks, each of the one or more matching networks being electrically connected between one of the two or more signal outputs of the first switch and one of the first and second RF filters.

5. The RF module of claim 1, further comprising a second switch electrically coupled between the first switch and the signal output.

6. The RF module of claim 5, wherein the second switch is an antenna switch and has an antenna terminal and an auxiliary terminal.

7. The RF module of claim 1, wherein the power amplifier is a multi-band amplifier.

8. The RF module of claim 1 wherein the RF module is a PA Module integrated Duplexer (PAMiD).

9. The RF module of claim 1, further comprising a switch register, wherein the analysis mode is activated by one or more switch register settings.

10. A method for testing a radio frequency (RF) module comprising a power amplifier, a first switch, and a filter section, the method comprising:
switching the first switch to an analysis mode, wherein the switch:
connects an auxiliary terminal to the filter section via at least one of two or more signal outputs of the first switch; and
decouples the filter section from the power amplifier; and
testing the filter section, without influence from the power amplifier, via the auxiliary terminal.

11. The method of claim 10, wherein switching the first switch comprises activating the analysis mode based on a corresponding switch register setting of the first switch.

12. The method of claim 10, wherein switching the first switch to the analysis mode comprises bypassing the power amplifier.

13. The method of claim 10, wherein the first switch comprises:
an input;
an auxiliary connection coupled to the auxiliary terminal;
a first signal output coupled to a first RF filter of the filter section; and
a second signal output coupled to a second RF filter of the filter section.

14. The method of claim 13, wherein testing the filter section comprises testing, based on a setting of the first switch, the first RF filter or the second RF filter.

15. The method of claim 13, wherein the first and second RF filters are transmission filters of respective duplexers, each duplexer comprising a respective reception filter.

16. The method of claim 13, wherein the RF module further comprises one or more matching networks, each of the one or more matching networks being electrically connected between one of the two or more signal outputs of the first switch and one of the first and second RF filters.

17. The method of claim 10, wherein the first switch is a transmission switch.

18. The method of claim 10, wherein the RF module further comprises a second switch electrically coupled between the first switch and a signal output of the RF module.

19. The method of claim 18, wherein the second switch is electrically coupled between the filter section and the signal output of the RF module.

* * * * *